United States Patent [19]

Reddy

[11] Patent Number: 5,523,975
[45] Date of Patent: Jun. 4, 1996

[54] REDUNDANCY SCHEME FOR MONOLITHIC MEMORIES

[75] Inventor: Chitranjan N. Reddy, Milpitas, Calif.

[73] Assignee: Alliance Semiconductor Corporation, San Jose, Calif.

[21] Appl. No.: 386,309

[22] Filed: Feb. 8, 1995

[51] Int. Cl.$^6$ ................................................. G11C 13/00
[52] U.S. Cl. ........................................ 365/200; 365/230.01
[58] Field of Search ............................... 365/200, 230.01

[56] References Cited

U.S. PATENT DOCUMENTS

| | | | |
|---|---|---|---|
| 5,377,146 | 12/1994 | Reddy et al. | 365/200 |
| 5,402,376 | 3/1995 | Horiguchi et al. | 365/200 |
| 5,459,690 | 10/1995 | Rieger et al. | 365/200 |

*Primary Examiner*—Terrell W. Fears
*Attorney, Agent, or Firm*—Bradley T. Sako

[57] ABSTRACT

An improved redundancy scheme for monolithic memory devices is disclosed. A memory device (10) has a quadrant array (12) of main memory quadrants (14). Each main memory quadrant (14) includes a number of memory cells arranged in a number of main memory rows (26) and main memory columns (28). A first level of redundancy is provided within each main memory quadrants (14) which has local redundant rows (36) and local redundant columns (38) for replacing defective cells therein. A second level redundancy is provided by redundant memory sections (20) which are used in combination to replace main memory quadrants (14) if necessary. The redundant memory sections (20) are disposed along the edge of the quadrant array (12). A third level of redundancy is provided by redundant section rows (52) and redundant section columns (54) within each redundant memory section (20) to replace defective cells therein.

16 Claims, 2 Drawing Sheets

REDUNDANCY SCHEME FOR MONOLITHIC MEMORIES

TECHNICAL FIELD

The present invention relates generally to high density memory circuits, and more particularly to schemes for providing redundant memory cells to replace defective memory cells.

BACKGROUND OF THE INVENTION

Semiconductor monolithic memory circuits continue to increase in capacity while at the same time, decreasing in size. Due to the large number of cells in memory devices, and the process sophistication required to produce them, it is not uncommon for memory devices to be fabricated with defective cells. Improved fabrication technology and process control can decrease the number of defects appearing in devices, but are rarely successful at completely eliminating such defects.

A second way to eliminate defective memory cells is to design memory devices with spare memory cells, and built-in redundancy schemes to replace defective cells with spare operational cells. It is well known in the prior art to provide one or more redundant rows and columns to a memory cell array. Using a redirectable decoding scheme addresses of defective cells are deselected, and substituted with redundant rows and/or columns.

While the addition of redundant rows and columns provides for the replacement of a limited number of cells and/or rows and columns, multiple column failures, or cell block failures cannot be corrected with just a few redundant rows or columns. To meet the need for these types of failures, improvements in redundancy schemes have included incorporating higher levels, or hierarchies, of redundancy.

Commonly-owned, U.S. Pat. No. 5,337,146, entitled HIERARCHICAL REDUNDANCY SCHEME FOR HIGH DENSITY MONOLITHIC MEMORIES and filed on Jul. 23, 1993, discloses a semiconductor memory device having main memory quadrants with redundant rows and columns, and at least one redundant quadrant having its own redundant rows and columns. The redundant hierarchy allows for the replacement of defective main memory cells with redundant rows, redundant columns, or if necessary, redundant quadrants.

While the use of entire redundant quadrants provides for an improved redundancy scheme, it is at the cost of area on the layout of the integrated circuit. In certain cases, the advantage of providing a redundant array is not worth the cost in area. It is therefore desirable to provide a redundancy scheme that allows for a redundant memory quadrant that does not require an integral block of area equal to a main memory quadrant.

Redundant quadrant schemes, and even local redundant rows have other drawbacks. Redundant memory cells within a redundant quadrant, row or column, may actually require a longer time to access than those within the main memory quadrants. This delay can arise in the case where a significant amount of time is required for the redundancy decoding scheme as it redirects an address from a known "bad" cell in the main memory quadrant to a "good" cell in the redundant quadrant. It is therefore also desirable to provide a redundancy scheme that provides redundant quadrants with memory cell access times that are equal to or shorter than those of the main memory cells.

SUMMARY OF THE INVENTION

It is an object of the present invention to provide a monolithic memory having redundant memory quadrants that do not consume the same integral amount of die area as main memory quadrants.

It is a further object of the present invention to provide a memory redundancy with redundant memory quadrants that have access times that are equal to or less than access times to main memory quadrants.

According to the invention a monolithic memory device is provided having a number of main memory quadrants arranged in an array. Arranged along one side of the array are a number of redundant memory sections. The number and arrangement of the redundant memory sections is such that one redundant memory section opposes each memory quadrant positioned along the array. The total number of redundant memory cells within all of the memory sections is equal to the total number of memory cells in one main memory quadrants. A redundant decoding scheme allows the redundant sections to function together as a redundant quadrant.

Because each memory section has fewer memory cells than the main memory quadrants, the columns and/or rows of the redundant memory sections are shorter in length than those of the main memory quadrant. This results in column and/or row conductors that are shorter in length than those in the main memory, and thus have less inherent capacitance and resistance. This results in faster rise times when driven, and thus faster access times. The reduction in access time can compensate for any delay caused by the redundancy decoding scheme required to access the redundant sections.

Other objects and advantages of the invention will become apparent in light of the following description thereof.

DETAILED DESCRIPTION OF THE EMBODIMENTS

Figure 1:
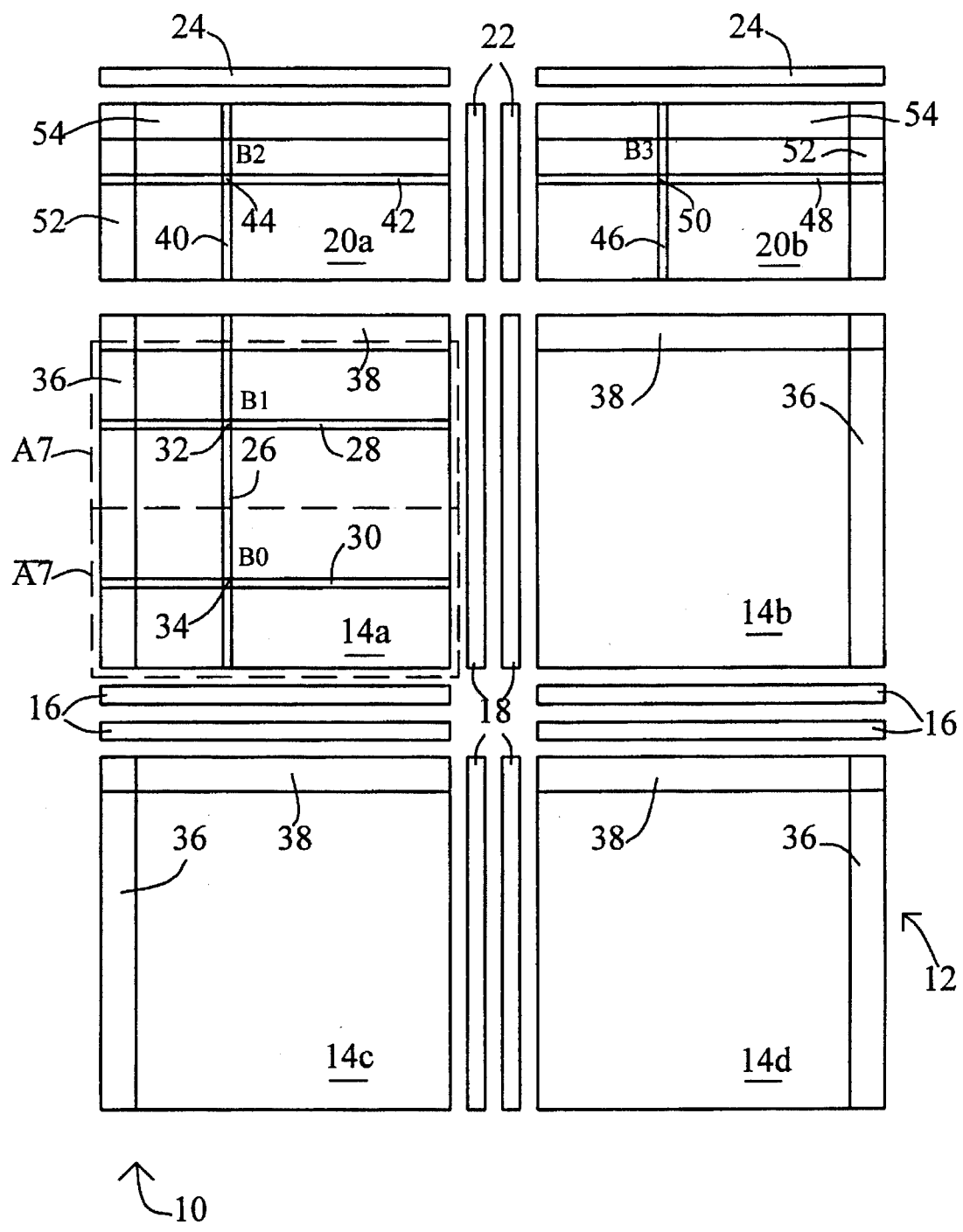
FIG. 1 is a block diagram illustrating the improved redundancy scheme of the present invention.

FIG. 1 sets forth, generally, an improved redundancy scheme for a monolithic memory as embodied in a semiconductor memory device 10 according to the present invention. The memory device 10 includes a quadrant array 12 having a number of individual main memory quadrants 14. Disposed intermediate each main memory quadrant 14 within the quadrant array 12 me main memory row decoders 16 and main memory column decoders 18. Along one side of the quadrant array 12, a redundant memory section 20 opposes one main memory quadrant 14. Situated between the redundant memory sections 20 are section column decoders 22. Section row decoders 24 are situated along the side of each memory section 20, opposite from the quadrant array 12.

The quadrant array 12 as set forth in the example of FIG. 1, is a two-by-two array of four main memory quadrants identified as 14a–14d. One skilled in the art would recognize that the present invention may also be employed on larger quadrant arrays. It is also understood that the term "quadrant" is used to describe an integral memory cell array of uniform size, and should not be considered as one quarter of the total amount of memory addressable or physically present on the integrated circuit. For example, the present invention is also realizable in a memory device having a quadrant array of size 2×8, having a total of 16 main memory quadrants.

In the example of FIG. 1, each main memory quadrant 14 has an equal number of main memory cells. As is well known in the art, the main memory cells are addressable by a main memory rows and main memory columns. The main memory rows runs generally perpendicular to the main memory row decoders 16. Similarly, the main memory columns run generally perpendicular to the main memory column decoders 18. In FIG. 1, a single main memory row 26, a first main memory columns 28, and a second main memory column 30, for quadrant 14a are fancifully depicted. At the intersection of the main memory row 26 and the first main memory column 28 is a first main memory cell $B_1$ 32. In a like manner, at the intersection of main memory row 26 and the second main memory column 30, is a second main memory cell $B_0$ 34. Each quadrant 14 in the example set forth in FIG. 1 has 256 rows and 256 columns of main memory.

As is also set forth in FIG. 1, each quadrant 14 also includes a number of local redundant rows 36 and local redundant columns 38. Utilizing well-known redundancy techniques, the local redundant rows and columns (36 and 38) of each quadrant 14 can be used to replace defective main memory rows and/or columns of their respective quadrants 14.

In the arrangement of FIG. 1, there are two redundant memory sections 20; a first redundant memory section 20a and a second redundant memory section 20b. The first redundant memory section 20a is adjacent to main memory quadrant 14a while the second redundant memory section is adjacent to main memory quadrant 14b. The redundant memory sections 20 include redundant section memory cells that are addressed by section rows and columns. Fancifully depicted in FIG. 1 are a first section row 40, a first section column 42, and a first redundant section cell 44 $B_2$. The second redundant memory section 20b includes a second section row 46, second section column 48, and corresponding second redundant section cell $B_3$ 50. For a higher level of redundancy, each redundant section 20 also includes a number of redundant section rows 52 and redundant section columns 54 that can be used to replace defective section rows or columns. In the example set forth in FIG. 1, each section 20 includes 256 rows and 128 columns.

The improved redundancy scheme of the present invention as embodied on the memory device 10 in FIG. 1, provides a first redundancy with the local redundant rows 36 and columns 38. The main memory cells of a quadrant (14a for example) are tested to detect defective cells, rows or columns. In the event defects are found, the main memory rows and columns are disabled, and the local redundant rows 38 and local redundant columns 40 are tested for defects. Using well-known techniques, such as laser fusible links, the defective main memory cells are replaced by known "good" local redundant rows and/or columns (36 and 38).

A further cell redundancy is presented by redundant sections 20. In the event that there are not enough local redundant rows and/or columns (36 and 38) in a given quadrant 14, the entire quadrant 14 can be replaced by the combination of the redundant sections 20. For example, assume that the first main memory cell $B_1$ 32 and the second main memory cell $B_0$ 34 of FIG. 1 are among the defective cells of quadrant 14a, and quadrant 14a, due to additional defective cells, cannot be repaired by its own local redundant rows and columns (36 and 38). As was mentioned previously, all the quadrants 14 include 256 rows. Using well-known decoder designs, the rows of quadrant 14a are selected by decoding eight address bits ($A_0$–$A_7$) by a one of 256 row decoder. Accordingly, a most significant row decoding bit, $A_7$ will select a first half of the quadrant 14a according to whether it is high or low. This decoding scheme is illustrated by the memory quadrant 14a being divided into a section A7 and $\overline{A7}$. In accordance with the redundancy scheme of the present invention, using fusible links, section A7 of quadrant 14a is replaced by redundant section 20a, while section $\overline{A7}$ of quadrant 14a is replaced by redundant section 20b. As set forth in FIG. 1, failing first main memory cell $B_1$ 32 will be remapped to redundant memory section 20a, while failing second main memory bit $B_1$ will be remapped to redundant memory section 20b.

Because the redundant sections 20 of FIG. 1 have only 128 columns while the quadrants 14 each include 256 columns, the length of the redundant section rows (52, for example) are approximately one half that of the main memory rows (26, for example). As a result, the inherent resistance and capacitance of the section rows is less than that of the main memory quadrants, resulting is faster row driving speeds. This can be particularly advantageous in compensating for unwanted delays caused by the redundancy scheme, that can be introduced by the circuitry required to replace a quadrant 14 with the memory sections 20.

Figure 2:
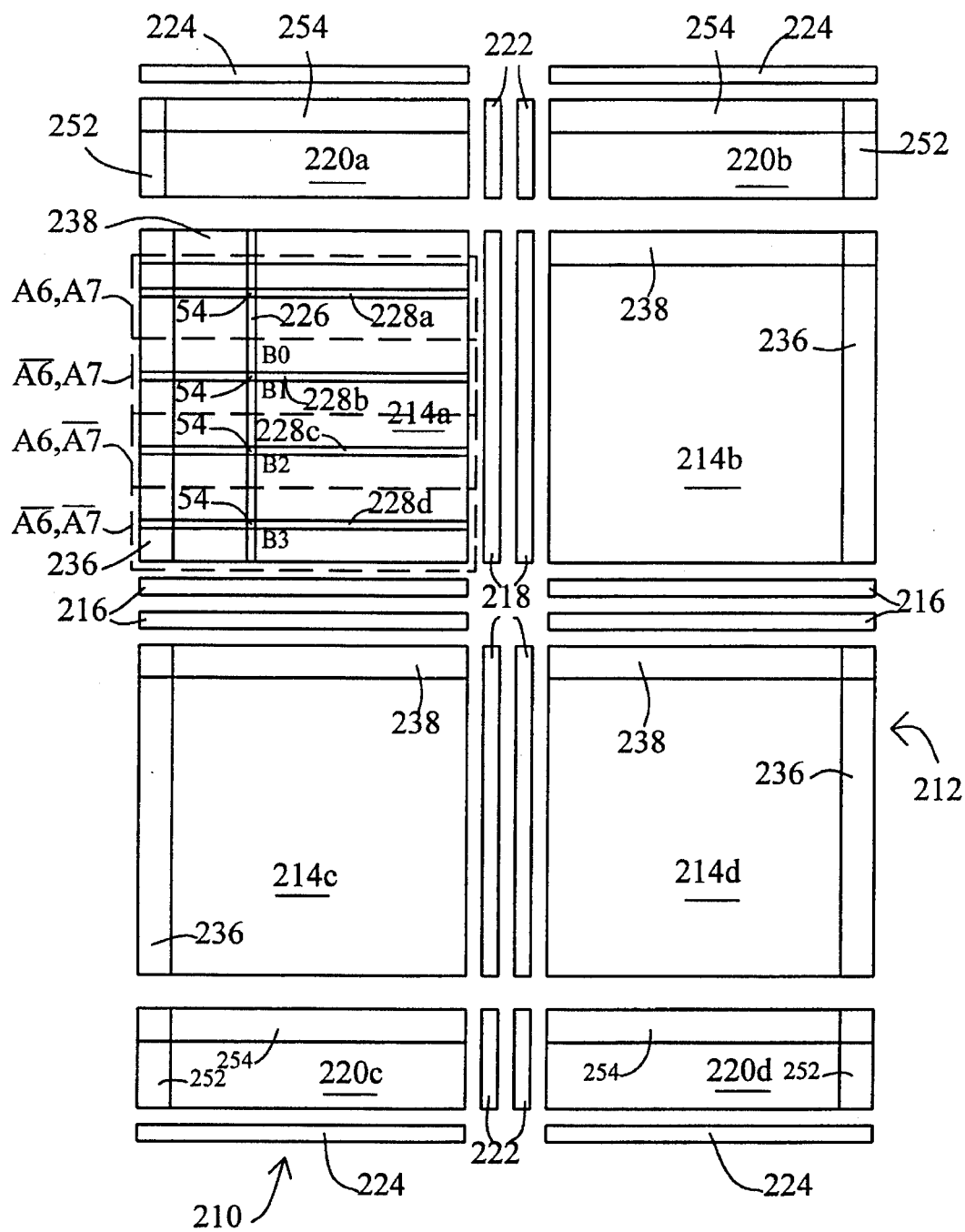
FIG. 2 is a block diagram illustrating an alternate embodiment of the present invention.

An alternate embodiment of the present invention is set forth in FIG. 2. The alternative embodiment is, in many respects, similar to the embodiment illustrated in FIG. 1. To this end, components which are identical to those appearing in FIG. 1, will be referred to by reference numbers incorporating the original reference with an initial digit "2".

The alternate embodiment is a semiconductor memory device 210 and is set forth in block diagram form in FIG. 2. The alternate embodiment includes a quadrant array 212 of four main memory quadrants 214 (designated 214a–214d), main memory row decoders 216, and main memory column decoders 218. As in the memory device set forth in FIG. 1, each quadrant 214 has a number of main memory rows and columns, as well as local redundant rows 236 and local redundant columns 238. In FIG. 2, a first through fourth (from a total of 256) main memory columns 228a–228d, and a main memory row 226 are fancifully designated within quadrant 214a. The intersection of the designated columns 228a–228d and row 226 will address four main memory bits $B_0$–$B_3$ 54.

Unlike the memory device 10 of FIG. 1, which employs two redundant memory sections 20, the alternate embodiment 210 includes four redundant memory sections 220, shown as 220a–220d. In FIG. 2, each memory section 220 is adjacent to a corresponding main memory quadrant 214, with memory sections 220c and 220d being on the opposite side of the quadrant array 212 from memory sections 220a and 220b. Disposed between memory sections 220a and 220b, and between 220c and 220d is a section column decoder 222. Each memory section 220 also has a corresponding section row decoder 224. As in the memory device 10 illustrated in FIG. 1, the section row decoders 224 are on the side of the memory section 220 that is opposite to the quadrant array 212.

In the alternate embodiment, within each memory section 220, there are one fourth the number of columns as there are in each main memory quadrant 214. The memory sections 220 are used in conjunction to form, in essence, a redundant quadrant. As in the embodiment of FIG. 1, a reconfigurable decoding scheme, using logic and fusible link designs that are well known in the art, can be used to redirect even portions of a defective main memory quadrant to the redundant memory sections 220. Referring once again to FIG. 2, quadrant 214a is shown subdivided into four sections according to two row address bits, A6 and A7. According to the logic state of A6 (i.e., A6 or $\overline{A6}$) and of A7 (A7 or $\overline{A7}$), one of the four sections is accessed. If quadrant 214a must be replaced, the addresses accessing quadrant 214a are redirected, area by area, to the redundant memory sections 220. As just one example, the area of quadrant 214a addressed by A6, A7 would be replaced by redundant memory section 220a. Correspondingly, area $\overline{A6}$, A7 would be replaced by section 220b, area A6, $\overline{A7}$ by section 220c, and area $\overline{A6}$, $\overline{A7}$ by section 220d. Accordingly, in the example of FIG. 2 $B_0$ would be remapped to section 220a, $B_1$ would be remapped to section 220b, $B_2$ would be remapped to section 220c, and $B_3$ would be remapped to section 220d.

Each redundant memory section 220 as shown in FIG. 2, further includes redundant section rows 252 and redundant section columns 254. As is illustrated in FIG. 2, the rows of the redundant memory sections 220 (including the redundant section rows 252) are approximately one quarter the length of the rows in the memory quadrants 214, and so have even less resistance and capacitance than those in the embodiment set forth in FIG. 1.

While the embodiments described herein set forth a single array of memory quadrants, it is understood that multiple quadrant arrays may be combined on a single semiconductor device. Such an arrangement would have an even higher level of redundancy. The programmable decoding scheme would allow the combinations of redundant sections from different quadrant arrays to create the logical equivalent of one or more redundant quadrants.

As will be apparent to one skilled in the art, the invention has been described in connection with its preferred embodiments, and may be changed, and other embodiments derived, without departing from the spirit and scope of the invention as set forth in the claims which follow.

INDUSTRIAL APPLICABILITY

The predominant intended usage of the present invention is as a redundancy scheme for dynamic random access memories (DRAMs) to improve the yield of operational dice from a given wafer. Following the detection of defective memory cells, the defective memory cells are replaced with local redundant rows and/or columns, or, if necessary redundant sections having their own redundant rows and columns by vaporizing the appropriate fusible links with a laser. The redundancy scheme of the present invention could also be used to improve the yield of other devices, including static random access memories (SRAMs) or other non-volatile memory structures, such as electrically erasable programmable memories (EEPROMs). The main areas of improvement are allowing a memory quadrant to be replaced with a more efficient layout of the device, and a reduction in row (or column) size of redundant sections, for faster read times from redundant cells.

Since the improved redundancy scheme of the present invention may be readily implemented with existing fabrication technologies, it is expected that it will be acceptable in the industry as an improvement over existing memory designs and redundancy schemes. For these and other reasons, it is expected that the utility and industrial applicability of the invention will be both significant in scope and long-lasting in duration.

What is claimed is:

1. In a monolithic memory device having a plurality of main memory quadrants, each main memory quadrant having at least one redundant row and at least one redundant column, an improved redundancy scheme, comprising:

at least one quadrant array of main memory quadrants, each main memory quadrant including a plurality of addressable main memory cells arranged in main memory rows and main memory columns for replacing defective main memory cells of the quadrant, each main memory quadrant further including at least one local redundant row and one local redundant column, the main memory quadrants defining sides of said quadrant array; and a plurality of redundant memory sections, said plurality of memory sections being disposed along at least one side of said array, each redundant section including a plurality of redundant memory cells arranged in section rows and section columns, each redundant section further including at least one redundant section column and one redundant section row for replacing defective redundant cells within the section, wherein the number of redundant memory cells within each redundant section is a fraction of the number of main memory cells in one memory quadrant, said plurality of redundant memory sections being addressable as an integral number of main memory quadrants.

2. The memory device of claim 1 wherein:

said array is of a size N by M, where N and M are integers greater than one, said array having a first side with a length generally equal to N quadrants; and said plurality of memory sections is equal to N, said plurality of memory sections being disposed along the first side of said array, each said memory section being adjacent to one memory quadrant, the number of redundant memory cells within each memory section being 1/Nth of the number of main memory cells within each memory quadrant.

3. The memory device of claim 2 wherein:

the integer N is two, said plurality of memory sections includes a first memory section and a second memory section.

4. The memory device of claim 1 wherein:

the main memory columns of each memory quadrant have a quadrant column length and the main memory rows of each memory quadrant have a quadrant row length;

the section columns of each memory section have a section column length and the section rows of each memory section have a section row length; and the quadrant column length is generally equal to the section column length and the section row length is less than the quadrant row length.

5. The memory device of claim 4 wherein:

the section row length is generally one half of the quadrant row length.

6. The memory device of claim 1 wherein:

the main memory columns have a quadrant column length and the main memory rows have a quadrant row length;

the section columns have a section column length and the section rows have a section row length; and the quadrant row length is generally equal to the section row length and the section column length is less than the quadrant column length.

7. The memory device of claim 6 wherein:

the section column length is generally one half of the quadrant column length.

8. The memory device of claim 1 wherein:

said array is of a size N by M, where N and M are integers greater than one, said array having a first side and an opposing second side, both the first and second sides having a length generally equal to N quadrants; and said plurality of memory sections is equal to twice N, N memory sections being disposed along the first side and the second side of said array, each said memory section being adjacent to one memory quadrant, the fraction of the number of redundant memory cells within each said section being art even multiple of 1/(2N) of the number of main memory cells within each memory quadrant.

9. The memory device of claim 8 wherein:

the integer N is two; and said plurality of redundant memory sections is equal to four, the number of redundant memory cells within each redundant memory section being one quarter of the number of main memory cells in each said main memory quadrant.

10. In a monolithic memory device having a plurality of main memory quadrants, each main memory quadrant having at least one redundant row and at least one redundant column, an improved redundancy scheme, comprising:

at least one quadrant array of main memory quadrants, each main memory quadrant including a plurality of addressable main memory cells arranged in main memory rows and main memory columns, each main memory quadrant further including at least one local redundant row and one local redundant column, the main memory quadrants defining sides of said quadrant array;

$2^N$ redundant memory sections disposed along at least one side of said array with N being an integer, each redundant section including a plurality of redundant memory cells equal to the fraction $1/(2^N)$ of the number of memory cells within each main memory quadrant, the redundant memory cells being arranged in section rows and section columns, each redundant section further including at least one redundant section column and one redundant section row, said plurality of redundant memory sections being addressable as at least one main memory quadrant;

reconfigurable decoding means for redirecting a plurality of addresses from a first physical location on the memory device to a second physical location on the memory device;

each said main memory quadrant is address decodable into $2^N$ equal portions by N address bits; wherein said reconfigurable decoding means is reconfigurable to redirect the addresses of one memory quadrant to said plurality of redundant memory sections, each permutation of the address bits corresponding to one redundant memory section.

11. The memory device of claim 10 wherein:

N is equal to one.

12. The memory device of claim 10 wherein:

the number of section rows is equal to the number of main memory rows and the number of section columns is equal to $1/(2^N)$ of the number of main memory columns.

13. The memory device of claim 9 wherein:

the number of section columns is equal to the number of main memory columns, and the number of section rows is equal to $1/(2^N)$ of the number of main memory rows.

14. In a semiconductor memory having a plurality of memory quadrants disposed in a quadrant array, each said memory quadrant having at least one local redundant row, and at least one local redundant column, the improvement comprising:

a plurality of redundant sections, each said section having at least one redundant section row and at least one redundant section column, each said section including a fraction of the memory cells within each said memory quadrant; and programmable decoding means for remapping all of the addresses of at least one memory quadrant to said redundant sections.

15. The improvement of claim 13 wherein:

each said redundant section includes one half the number of memory cells within each said quadrant.

16. The improvement of claim 14 wherein:

said programmable decoding means includes fusible links.

\* \* \* \* \*